under 35

(12) United States Patent
Fukuyama et al.

(10) Patent No.: US 11,362,669 B2
(45) Date of Patent: Jun. 14, 2022

(54) TRACK AND HOLD CIRCUIT

(71) Applicant: Nippon Telegraph and Telephone Corporation, Tokyo (JP)

(72) Inventors: Hiroyuki Fukuyama, Musashino (JP); Naoki Miura, Musashino (JP); Hideyuki Nosaka, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 26 days.

(21) Appl. No.: 16/976,416

(22) PCT Filed: Mar. 28, 2019

(86) PCT No.: PCT/JP2019/013657
§ 371 (c)(1),
(2) Date: Aug. 27, 2020

(87) PCT Pub. No.: WO2019/189602
PCT Pub. Date: Oct. 3, 2019

(65) Prior Publication Data
US 2021/0050860 A1 Feb. 18, 2021

(30) Foreign Application Priority Data

Mar. 30, 2018 (JP) .............................. JP2018-067052

(51) Int. Cl.
*H03M 1/00* (2006.01)
*H03M 1/12* (2006.01)
*H03F 3/45* (2006.01)

(52) U.S. Cl.
CPC ...... *H03M 1/1245* (2013.01); *H03F 3/45076* (2013.01)

(58) Field of Classification Search
CPC .......................... H03M 1/1245; H03F 3/45076
(Continued)

(56) References Cited

U.S. PATENT DOCUMENTS 3,631,356 A * 12/1971 Aschermann ........ H03G 1/0023
330/261
5,392,172 A * 2/1995 Yoshinaga ............. G11B 5/012
360/46
(Continued)

FOREIGN PATENT DOCUMENTS

JP H07-115376 A 5/1995
JP H07-336225 A 12/1995
JP 2007-306086 A 11/2007

OTHER PUBLICATIONS

Shahriar Shahramian et al., *A 40-GSamples/Sec Track & Hold Amplifier in 0.18 μm SiGe BiCMOS Technology*, CSIC Digest, 2005, pp. 101-104.

(Continued)

*Primary Examiner* — Peguy Jean Pierre
(74) *Attorney, Agent, or Firm* — Workman Nydegger (57) ABSTRACT

Provided is a track-and-hold circuit capable of reducing the power consumption of a differential amplifier circuit while preserving the broadband nature (without narrowing the bandwidth). In the track-and-hold circuit 1 including a differential amplifier circuit 10, a switch circuit 20, and a hold capacitor $C_{21}$, the differential amplifier circuit 10 includes a first resistor $R_{11}$ having one end connected to a collector electrode of a first transistor $Q_{11}$ constituting a differential pair, a second resistor $R_{12}$ having one end connected to the collector electrode of a second transistor $Q_{12}$ constituting the differential pair, and a third resistor $R_{13}$ to which the other end of the first resistor $R_{11}$ and the other end of the second resistor $R_{12}$ are connected and which is connected between the other ends and a power supply $V_{CC}$.

4 Claims, 8 Drawing Sheets

(58) Field of Classification Search
USPC .................................. 341/122, 155, 118, 120
See application file for complete search history.

(56) References Cited

U.S. PATENT DOCUMENTS

| | | | | |
|---|---|---|---|---|
| 5,428,307 | A * | 6/1995 | Dendinger | G01R 19/04 |
| | | | | 327/60 |
| 6,094,093 | A * | 7/2000 | Karanicolas | H03F 1/3241 |
| | | | | 327/560 |
| 2014/0016949 | A1* | 1/2014 | Koizumi | H04B 10/60 |
| | | | | 398/212 |

OTHER PUBLICATIONS

International Search Report and Written Opinion dated Jun. 11, 2019, issued in PCT Application No. PCT/JP2019/013657, filed Mar. 28, 2019.

* cited by examiner

TRACK AND HOLD CIRCUIT

TECHNICAL FIELD

The present disclosure relates to a track-and-hold circuit.

BACKGROUND ART

The track-and-hold circuit is a circuit used in the previous stage of an analog/digital conversion circuit to increase the conversion accuracy, for example, when converting an analog signal to a digital signal, and includes a differential amplifier circuit, a switch circuit, and a hold capacitor. The track-and-hold circuit switches between two modes, a track mode and a hold mode, according to the level (High/Low) of the input clock signal.

In the case of the track mode, the switching transistor of the switch circuit connected in parallel to the hold capacitor operates as an emitter follower, and outputs the voltage signal output from the differential amplifier circuit to the hold capacitor. In the case of the hold mode, the voltage value output from the differential amplifier circuit is held in the hold capacitor at the timing when the mode is switched from the track mode to the hold mode. In the hold mode, the switching transistor transitions to an off state.

The track-and-hold circuit is a well-known circuit disclosed in, for example, Non-Patent Literature 1, which is also called a sample-and-hold circuit.

CITATION LIST

Non Patent Literature

Non-Patent Literature 1: S. Shahramian, et al. "A40-G Sample/Sec Track & Hold Amplifier in 0.18 µm SiGe BiCMOS Technology", IEEE Compound Semiconductor Integrated Circuit Symposium, 2005.

SUMMARY OF THE INVENTION

Technical Problem

In the configuration of the track-and-hold circuit in the related art, it is necessary to reduce the resistance values of the load resistors of the transistors constituting the differential pair of the differential amplifier circuit, to secure the broadband nature of the differential amplifier circuit. Thus, in the hold mode, it is necessary to set a large value of a current flowing through the switch circuit to completely turn off the switching transistor. As a result, there is a problem that the power consumption of the circuit increases.

In other words, when the value of a current flowing through the switch circuit is reduced to reduce power consumption while maintaining the configuration of the track-and-hold circuit in the related art, it is necessary to increase the resistance value of the load resistor, and there is a problem that the broadband nature of the differential amplifier circuit is impaired and the bandwidth is narrowed.

The present disclosure has been made in view of this problem, and an object of the present disclosure is to provide a track-and-hold circuit in which the power consumption of the differential amplifier circuit is reduced while preserving the broadband nature (without narrowing the band).

Means for Solving the Problem

A track-and-hold circuit according to an aspect of the present embodiment is a track-and-hold circuit including: a differential amplifier circuit; a switch circuit; and a hold capacitor, in which the differential amplifier circuit includes a first resistor having one end connected to a collector electrode of a first transistor constituting a differential pair, a second resistor having one end connected to a collector electrode of a second transistor constituting the differential pair, and a third resistor to which the other end of the first resistor and the other end of the second resistor are connected and which is connected between the other ends and a power supply.

A track-and-hold circuit according to another aspect of the present embodiment is a track-and-hold circuit including: a differential amplifier circuit; a switch circuit; and a hold capacitor, in which the differential amplifier circuit includes a fourth resistor connected between respective collector electrodes of a first transistor and a second transistor constituting a differential pair, a fifth resistor connected between the collector electrode of the first transistor and a power supply, and a sixth resistor connected between the collector electrode of the second transistor and the power supply.

Effects of the Invention

According to the present disclosure, it is possible to provide a track-and-hold circuit in which the power consumption of the differential amplifier circuit is reduced while preserving the broadband nature (without narrowing the bandwidth).

DESCRIPTION OF EMBODIMENTS

Hereinafter, embodiments of the present disclosure will be described with reference to the drawings. The same components in a plurality of drawings have the same reference symbols, and a description of the components will not be repeated.

First Embodiment

Configuration of Track-and-Hold Circuit

Figure 1:
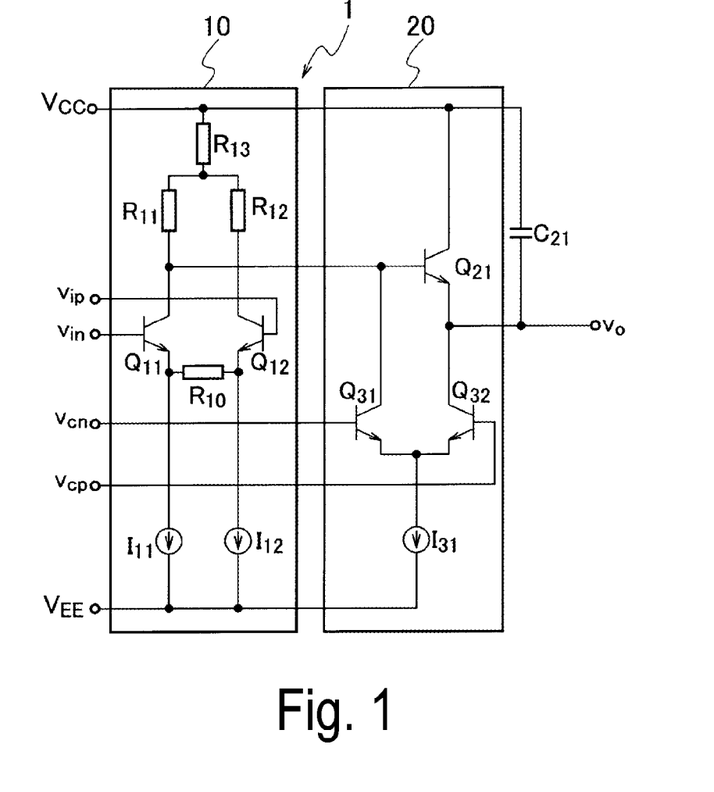
FIG. 1 is a diagram illustrating a configuration example of a track-and-hold circuit according to a first embodiment.

FIG. 1 is a diagram illustrating a configuration example of a track-and-hold circuit 1 according to a first embodiment. The track-and-hold circuit 1 illustrated in FIG. 1 includes a differential amplifier circuit 10, switch circuit 20, and a hold capacitor $C_{21}$.

The differential amplifier circuit 10 includes a differential pair including a first transistor $Q_{11}$ and a second transistor $Q_{12}$, a current source $I_{11}$ and a current source $I_{12}$ connected in series to respective emitter electrodes of the differential pair, and a resistor $R_{10}$ connected between the emitter electrodes of the differential pair. Included are a first resistor $R_{11}$ having one end connected to a collector electrode of the first transistor $Q_{11}$, a second resistor $R_{12}$ having one end connected to a collector electrode of the second transistor $Q_{12}$, and a third resistor $R_{13}$ to which the other end of the first resistor $R_{11}$ and the other end of the second resistor $R_{12}$ are connected and which is connected between the other ends and a positive power supply $V_{CC}$.

The base electrode of the first transistor $Q_{11}$ is an inverted signal input terminal, and receives an inverted input signal vin. The base electrode of the second transistor $Q_{12}$ is a non-inverted signal input terminal, and receives a non-inverted input signal vip. The differential input signals vin and vip are amplified by the differential amplifier circuit 10 and output from the collector electrode of the first transistor $Q_{11}$. The collector electrode of the first transistor $Q_{11}$ is the non-inverted output of the differential amplifier circuit 10.

The switch circuit 20 includes a switching transistor $Q_{21}$ having a collector electrode connected to a positive power supply $V_{CC}$, a transistor $Q_{31}$ having a collector electrode connected to a base electrode of the switching transistor $Q_{21}$, a transistor $Q_{32}$ having a collector electrode connected to an emitter electrode of the switching transistor $Q_{21}$, and a current source $I_{31}$ connected between the emitter electrodes of the transistors $Q_{31}$ and $Q_{32}$ and a negative power supply $V_{EE}$.

The base electrode of transistor $Q_{31}$ is an inverted clock input terminal, and receives an inverted clock signal $V_{cn}$. The base electrode of transistor $Q_{32}$ is a clock input terminal, and receives a non-inverted clock signal $V_{cp}$. The inverted clock signal $V_{cn}$ and the non-inverted clock signal $V_{cp}$ are differential clock signals.

The hold capacitor $C_{21}$ is connected in parallel with the switching transistor $Q_{21}$. That is, one end of the hold capacitor $C_{21}$ is connected to the emitter electrode of the switching transistor $Q_{21}$, and the other end of the hold capacitor $C_{21}$ is connected to the positive power supply $V_{CC}$. One end of the hold capacitor $C_{21}$ becomes an output terminal of the track-and-hold circuit 1 and outputs an output signal vo.

Operation

In the track-and-hold circuit 1, the state of the output signal vo changes according to the input values of the differential clock signals $V_{cp}$, $V_{cn}$. When the differential clock signal is High, that is, when $V_{cp} > V_{cn}$ (track state), the transistor $Q_{31}$ is turned off, and the transistor $Q_{32}$ is turned on.

In this track state, the current generated by the current source $I_{31}$ flows between the emitter and collector of the switching transistor $Q_{21}$, and the switching transistor $Q_{21}$ operates as an emitter follower. The differential input signals vin and vip in this case are amplified by the differential amplifier circuit 10 and output from the collector electrode of the first transistor $Q_{11}$. The output signal (non-inverted output) of the differential amplifier circuit 10 is output as the output signal vo of the track-and-hold circuit 1 via the switching transistor $Q_{21}$ operating as an emitter follower.

The voltage of the output signal vo of the track-and-hold circuit 1 in this case (track state) changes according to changes in the differential input signals vin and vip.

On the other hand, when the differential clock signal is Low, that is, when $V_{cp} < V_{cn}$ (hold state), the transistor $Q_{31}$ is turned on, and the transistor $Q_{32}$ is turned off. In this hold state, the current generated by the current source $I_{31}$ flows through the first resistor $R_{11}$. As a result, the potential of the base electrode of the switching transistor $Q_{21}$ decreases and the switching transistor $Q_{21}$ is turned off.

In the hold state where the switching transistor $Q_{21}$ is turned off, the hold capacitor $C_{21}$ operates to hold the potential of output signal vo. Thus, the output signal vo holds the output signal (potential of the non-inverted output) of the differential amplifier circuit 10 immediately before the clock signal $V_{cp}$ switches from High to Low irrespective of changes in the differential input signals vin and vip.

Here, the sum of the current values of the current source $I_{11}$ and the current source $I_{12}$ is $I_A$, the respective resistance values of the first resistor $R_{11}$ and the second resistor $R_{12}$ are $R_L$, and the resistance value of the third resistor $R_{13}$ is $R_C$. In the track state, the voltage between the base and the emitter when the switching transistor $Q_{21}$ is in the On state is set to $V_{BEon}$. In the track state where the switching transistor $Q_{21}$ is in On state, the potential of output signal vo can vary in the range of $V_{CC} - R_C I_A - R_L I_A - V_{BEon}$ to $V_{CC} - R_C I_A - V_{BEon}$.

On the other hand, in the hold state where the switching transistor $Q_{21}$ is in Off state, the current of the current value $I_S$ generated by the current source $I_{31}$ flows through the first resistor $R_{11}$. Thus, the potential of the collector electrode of the first transistor $Q_{11}$ which is the output of the differential amplifier circuit 10 changes within the range of $V_{CC} - R_C I_S - R_L I_S - R_C I_A - R_L I_A$ to $V_{CC} - R_C I_S - R_L I_S - R_C I_A$.

In the hold state, the switching transistor $Q_{21}$ needs to always be in the off state, so that the relationship illustrated in the following equation needs to be satisfied. Here, $V_{BEoff}$ is a voltage between the base and the emitter when the switching transistor $Q_{21}$ is in an off state.

Formula 1

$$(V_{CC} - R_C I_S - R_L I_S - R_C I_A) - (V_{CC} - R_C I_A - R_L I_A - V_{BEon}) < V_{BEoff} \quad (1)$$

The first term on the left-hand side of Equation 1 represents the maximum value of the potential of the base electrode of the switching transistor $Q_{21}$ in the hold state. The second term on the left-hand side represents the minimum value of the potential of the emitter electrode of the switching transistor $Q_{21}$ in the same state.

When Equation (1) is arranged for the current value $I_S$ of the current source $I_{31}$, the following equation is obtained.

Formula 2

$$I_S > \frac{R_L}{R_C + R_L} I_A + \frac{V_{BEon} - V_{BEoff}}{R_C + R_L} \quad (2)$$

Equation (2) indicates that the current value $I_S$ generated by the current source $I_{31}$ may be smaller than the same current value $I_S$ of a comparative example described later. That is, by providing the third resistor $R_{13}$ between the connection point of the first resistor $R_{11}$ and the second resistor $R_{12}$ and the positive power supply $V_{CC}$, the current value $I_S$ of the current source $I_{31}$ can be reduced without narrowing the bandwidth of the differential amplifier circuit 10. That is, the resistance values of the first resistor $R_{11}$ and the second resistor $R_{12}$ do not need to be increased, so that the current value $I_S$ can be reduced without narrowing the bandwidth of the differential amplifier circuit 10.

Figure 2:
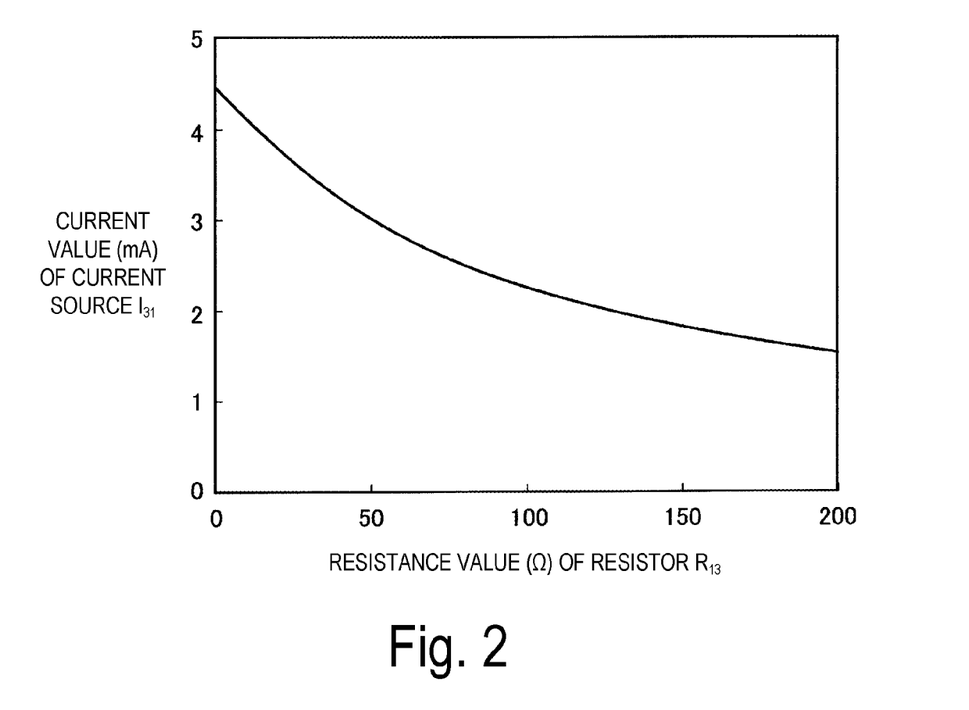
FIG. 2 is a graph illustrating a relationship between a resistance value of a third resistor and a current value of a current source, illustrated in FIG. 1.

FIG. 2 is a graph illustrating a relationship between the resistance value of the third resistor $R_{13}$ and the current value $I_S$ generated by the current source $I_{31}$. FIG. 2 illustrates the result of a simulation under the conditions of $I_A$=2 mA, $R_L$=100Ω, and $V_{BEon}$-$V_{BEoff}$=250 mV. The horizontal axis in FIG. 2 represents the resistance value (Ω) of the third resistor $R_{13}$, and the vertical axis represents the current value (mA) of the current source $I_{31}$.

As illustrated in FIG. 2, when the third resistor $R_{13}$ is not provided ($R_{13}$=0Ω), the current source $I_{31}$ needs to generate a current of 4.5 mA or more. When the third resistor $R_{13}$ is provided and its resistance value is set to about $R_{13}$=150Ω, it can be seen that the current source $I_{31}$ may generate a current of about 2 mA.

As described above, in the track-and-hold circuit 1 according to the present embodiment is a track-and-hold circuit including the differential amplifier circuit 10, the switch circuit 20, and the hold capacitor $C_{21}$, the differential amplifier circuit 10 includes a first resistor $R_{11}$ having one end connected to a collector electrode of a first transistor $Q_{11}$ constituting a differential pair, a second resistor $R_{12}$ having one end connected to a collector electrode of a second transistor $Q_{12}$ constituting the differential pair, and a third resistor $R_{13}$ to which the other end of the first resistor $R_{11}$ and the other end of the second resistor $R_{12}$ are connected and which is connected between the other ends and a power supply (positive power supply $V_{CC}$). Thus, the current value $I_S$ of the current source $I_{31}$ can be reduced without narrowing the bandwidth of the differential amplifier circuit 10. That is, it is possible to provide a track-and-hold circuit in which the power consumption is reduced while preserving the broad-band nature of the differential amplifier circuit 10.

Second Embodiment

Figure 3:
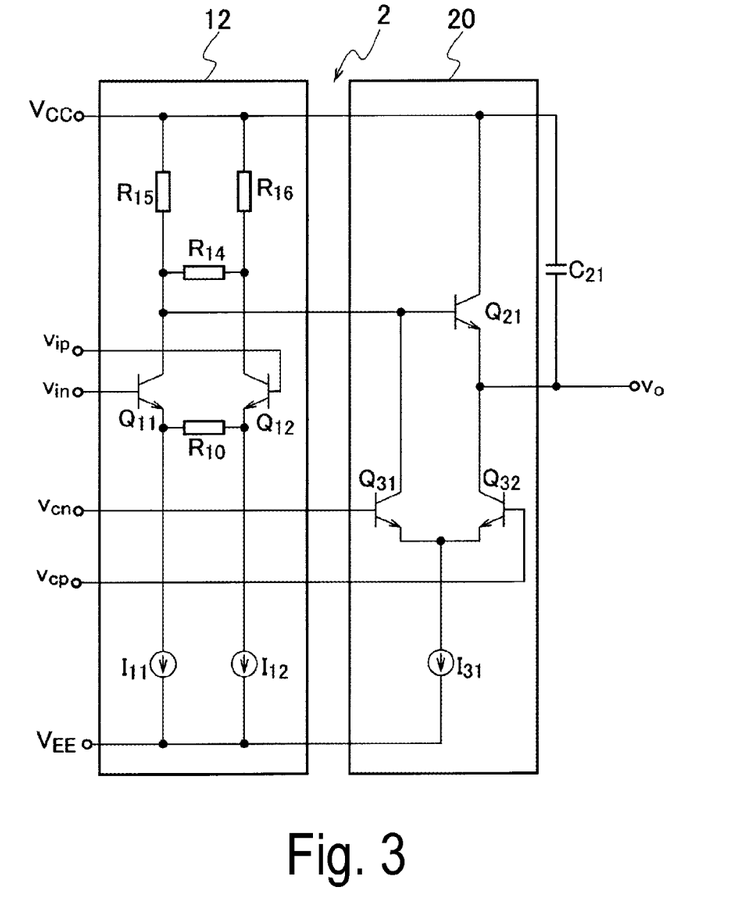
FIG. 3 is a diagram illustrating a configuration example of a track-and-hold circuit according to a second embodiment.

FIG. 3 is a diagram illustrating a configuration example of a track-and-hold circuit 2 according to a second embodiment. The track-and-hold circuit 2 illustrated in FIG. 3 differs from the track-and-hold circuit 1 in that a differential amplifier circuit 12 is provided instead of the differential amplifier circuit 10 (FIG. 1) of the track-and-hold circuit 1.

The differential amplifier circuit 12 includes a fourth resistor $R_{14}$ connected between respective collector electrodes of the first transistor $Q_{11}$ and the second transistor $Q_{12}$ constituting a differential pair, a fifth resistor $R_{15}$ connected between the collector electrode of the first transistor $Q_{11}$ and the positive power supply $V_{CC}$, and a sixth resistor $R_{16}$ connected between the collector electrode of the second transistor $Q_{12}$ and the positive power supply $V_{CC}$.

The resistance value of the fourth resistor $R_{14}$ is $R_D$, the resistance value of the fifth resistor $R_{15}$ and the sixth resistor $R_{16}$ is $R_B$, and the resistance values are set such that the following equation is satisfied.

Equation 3

$$R_D = 2R_L + \frac{R_L^2}{R_C} \quad (3)$$

$$R_B = R_L + 2R_C \quad (4)$$

When each resistance value is set as illustrated in Equations (3) and (4), a circuit network including the fourth resistor $R_{14}$, the fifth resistor $R_{15}$, and the sixth resistor $R_{16}$ is equivalent to a circuit network including the first resistor $R_{11}$, the second resistor $R_{12}$, and the third resistor $R_{13}$, illustrated in FIG. 1. Thus, the track-and-hold circuit 2 in which the respective resistance values are set as described above has the same operation and effect as the track-and-hold circuit 1.

That is, the track-and-hold circuit 2 according to the present embodiment is a track-and-hold circuit including a differential amplifier circuit 12, a switch circuit 20, and a hold capacitor $C_{21}$. The differential amplifier circuit 12 includes a fourth resistor $R_{14}$ connected between the respective collector electrodes of the first transistor $Q_{11}$ and the second transistor $Q_{12}$ constituting a differential pair, a fifth resistor $R_{15}$ connected between the collector electrode of the first transistor $Q_{11}$ and a power supply (positive power supply $V_{CC}$), and a sixth resistor $R_{16}$ connected between the collector electrode of the second transistor $Q_{12}$ and the power supply. This makes it possible to provide the track-and-hold circuit 2 with low power consumption without narrowing the bandwidth of the differential amplifier circuit 12.

Third Embodiment

Figure 4:
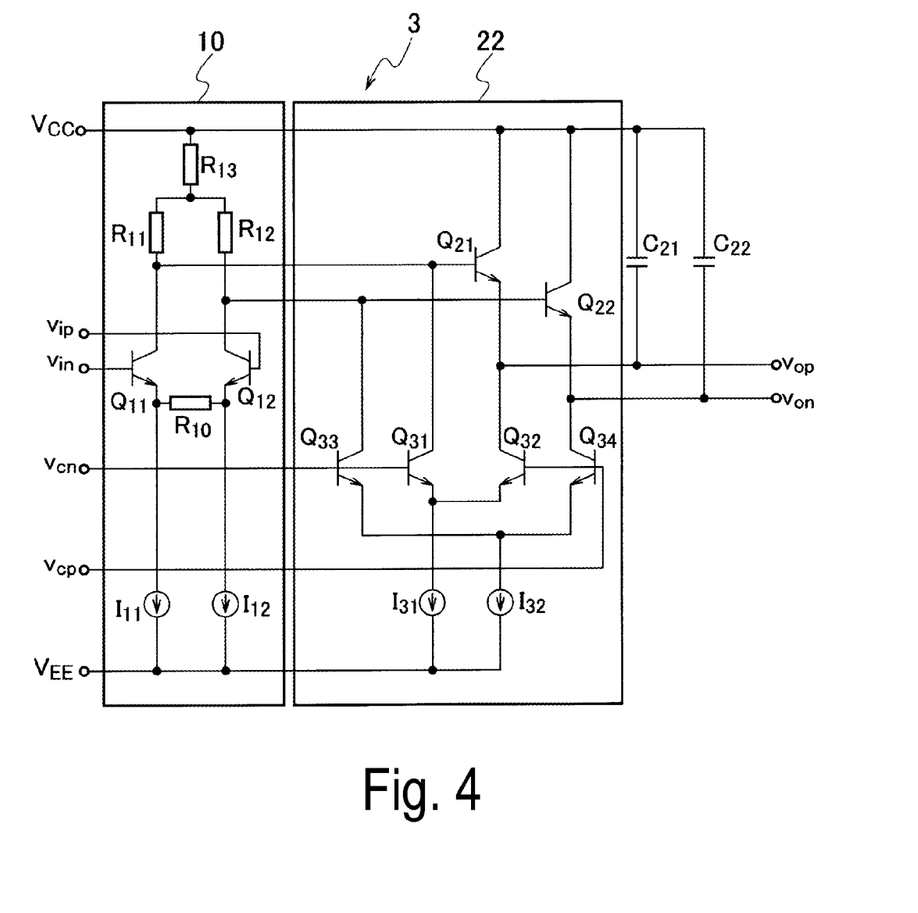
FIG. 4 is a diagram illustrating a configuration example of a track-and-hold circuit according to a third embodiment.

FIG. 4 is a diagram illustrating a configuration example of a track-and-hold circuit 3 according to a third embodiment. The track-and-hold circuit 3 illustrated in FIG. 4 differs from the track-and-hold circuit 1 (FIG. 1) in that the track-and-hold circuit 3 includes a switch circuit 22 and a hold capacitor $C_{22}$.

In addition to the switch circuit 22 illustrated in FIG. 1, the switch circuit 20 includes a switching transistor $Q_{22}$ having a collector electrode connected to the positive power supply $V_{CC}$, a transistor $Q_{33}$ having a collector electrode connected to a base electrode of the switching transistor $Q_{22}$, a transistor $Q_{34}$ having a collector electrode connected to an emitter electrode of the switching transistor $Q_{22}$, and a current source $I_{32}$ is connected between the emitter electrodes of the transistors $Q_{33}$ and $Q_{34}$ and the negative power supply $V_{EE}$.

The base electrode of transistor $Q_{33}$ of the switch circuit 22 is an inverted clock input terminal, and receives an inverted clock signal $V_{cn}$. The base electrode of transistor $Q_{34}$ is a clock input terminal, and receives a clock signal $V_{cp}$.

The hold capacitor $C_{22}$ is connected in parallel with the switching transistor $Q_{22}$. That is, one end of the hold capacitor $C_{22}$ is connected to the emitter electrode of the switching transistor $Q_{22}$, and the other end of the hold capacitor $C_{22}$ is connected to the positive power supply $V_{CC}$. Then, the hold capacitor $C_{22}$ operates to hold the output voltage of the inverted output (the collector electrode of the second transistor $Q_{12}$) of the differential amplifier circuit 10.

The operations of the switching transistor $Q_{22}$, the transistor $Q_{33}$, the transistor $Q_{34}$, and the current source $I_{32}$ are the same as the operations of the switching transistor $Q_{21}$, the transistor $Q_{31}$, the transistor $Q_{32}$, and the current source $I_{31}$, respectively. Thus, the configuration is illustrated in FIG. 4 and the description of the operation is omitted.

According to the track-and-hold circuit 3 of the present embodiment, the non-inverted output of the differential amplifier circuit 10 can be held in the hold capacitor $C_{21}$, and the inverted output of the differential amplifier circuit 10 can be held in the hold capacitor $C_{22}$, respectively. The track-and-hold circuit 3 provides a track-and-hold circuit in which power consumption is reduced without narrowing the bandwidth of the differential amplifier circuit 10 like the track-and-hold circuits 1 and 2.

Fourth Embodiment

Figure 5:
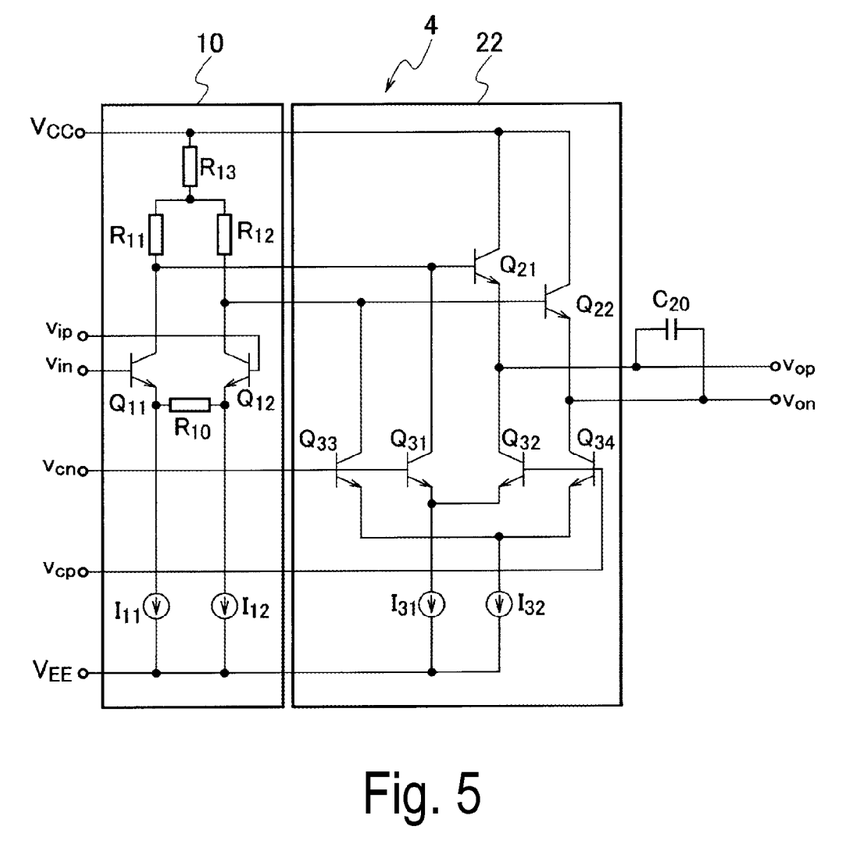
FIG. 5 is a diagram illustrating a configuration example of a track-and-hold circuit according to a fourth embodiment.

FIG. 5 is a diagram illustrating a configuration example of a track-and-hold circuit 4 according to a fourth embodiment.

The track-and-hold circuit 4 illustrated in FIG. 5 is different from the above-described embodiments in that the track-and-hold circuit 4 includes one hold capacitor $C_{20}$.

The hold capacitor $C_{20}$ is connected between the emitter electrode of the switching transistor $Q_{21}$ and the emitter electrode of the switching transistor $Q_{22}$, and holds the voltage of the difference between the output signals vop and von.

In other words, the track-and-hold circuit 4 according to the present embodiment is different from the track-and-hold circuit 3 in that the hold capacitor $C_{20}$ connected between the respective emitter electrodes of the switching transistor $Q_{21}$ and the switching transistor $Q_{22}$ is included.

According to the track-and-hold circuit 4, the number of components can be reduced, in addition to the above-described effect that the power consumption can be reduced without narrowing the bandwidth of the differential amplifier circuit 10.

Fifth Embodiment

Figure 6:
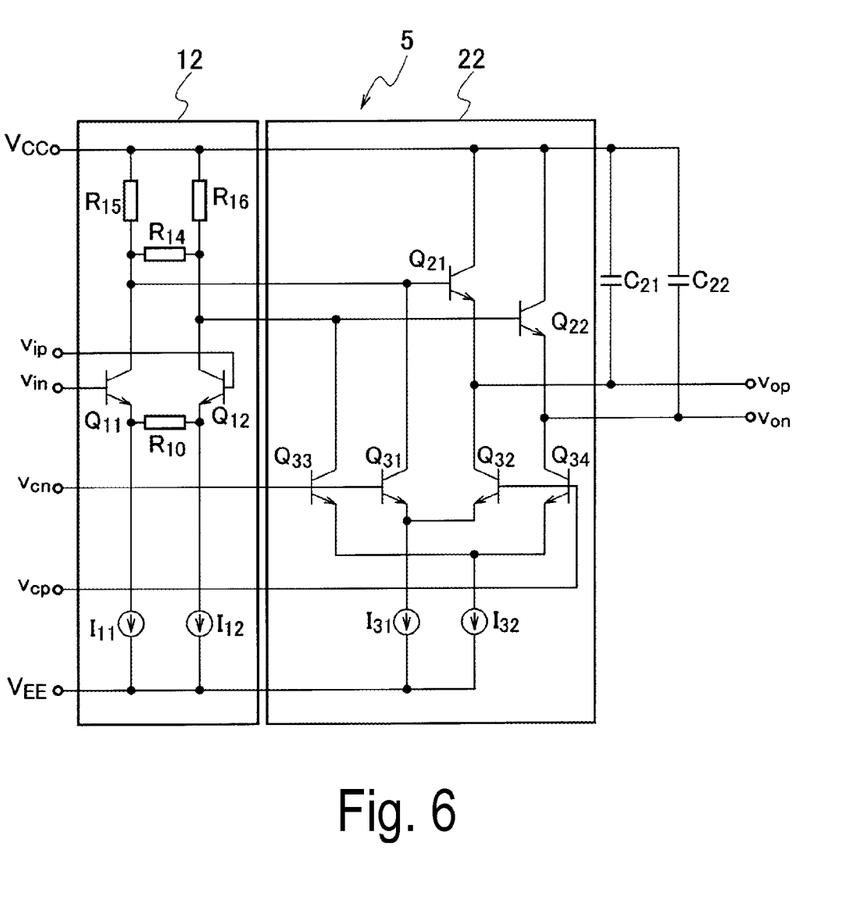
FIG. 6 is a diagram illustrating a configuration example of a track-and-hold circuit according to a fifth embodiment.

FIG. 6 is a diagram illustrating a configuration example of a track-and-hold circuit 5 according to a fifth embodiment. As illustrated in FIG. 6, the track-and-hold circuit 5 has a configuration in which the differential amplifier circuit 12 (FIG. 3) and the switch circuit 22 (FIG. 4) are combined.

The operation and effect of the track-and-hold circuit 5 according to the present embodiment are the same as the operation and effect of the track-and-hold circuit 3 (FIG. 4). Thus, the description is omitted.

Comparative Example

Figure 7:
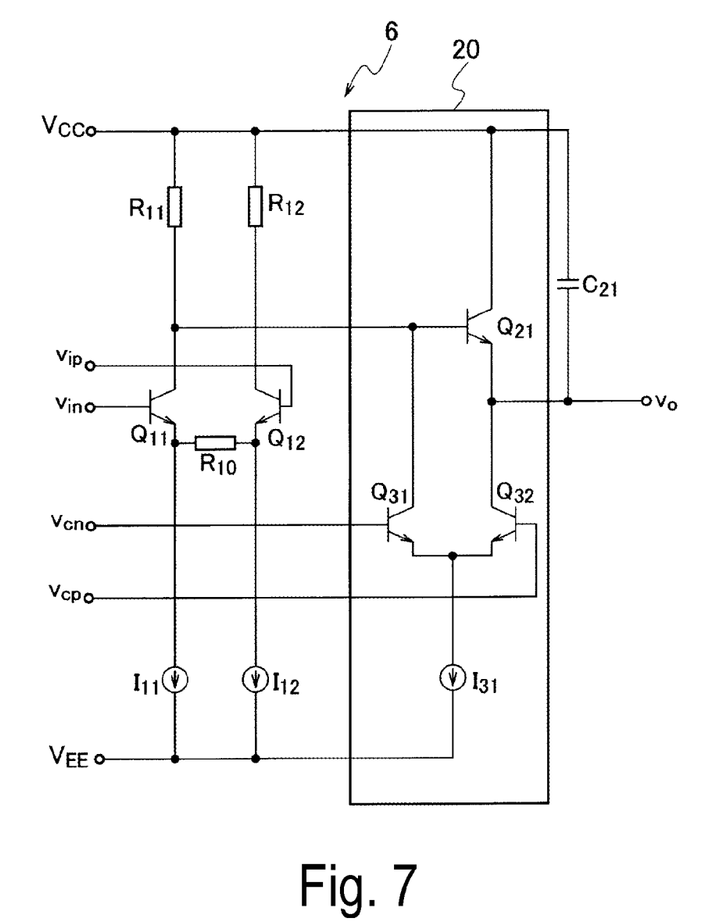
FIG. 7 is a diagram illustrating a configuration example of a track-and-hold circuit of a comparative example.

FIG. 7 is a diagram illustrating a configuration example of a track-and-hold circuit 6 of a comparative example. As illustrated in FIG. 7, the track-and-hold circuit 6 is in which the third resistor $R_{13}$ of the differential amplifier circuit 10 of the track-and-hold circuit 1 is removed, the load resistor connected to the collector electrode of the first transistor $Q_{11}$ is a first resistor $R_{11}$, and the load resistor connected to the collector electrode of the second transistor $Q_{12}$ is a second resistor $R_{12}$.

An equation corresponding to the above Equation (1) in the comparative example can be expressed by the following equation.

Equation 4

$$(V_{CC}-R_L I_S)-(V_{CC}-R_L I_A-V_{BEon}) < V_{BEoff} \quad (5)$$

When Equation (5) is arranged for the current value $I_S$ of the current source $I_{31}$, the following equation is obtained.

Equation 5

$$I_S > I_A + \frac{V_{BEon} - V_{BEoff}}{R_L} \quad (6)$$

According to Equation (6), it can be seen that the current value $I_S$ of the current source $I_{31}$ needs to be larger than the value obtained by adding the sum $I_A$ of the current values of the current sources $I_{11}$ and $I_{12}$ and a value obtained by dividing the difference between $V_{BEon}$ and $V_{BEoff}$ by the resistance value of $R_L$ of the first resistor $R_{11}$. That is, the current value $I_S$ of the current source $I_{31}$ of the comparative example is larger than any of the track-and-hold circuits 1 to 5 according to the present embodiments.

As described above, according to the track-and-hold circuits 1 to 5 according to the present embodiments, it is understood that the power consumption of the track-and-hold circuit can be reduced without narrowing the bandwidth of the differential amplifier circuits 10 and 11.

As described above, according to the track-and-hold circuits 1 to 5 of the present embodiments, track-and-hold circuits with low power consumption without narrowing the bandwidth of the differential amplifier circuit is provided.

Further, according to the track-and-hold circuits 1 to 5 of the present embodiment, an effect is obtained that the switching transistor can operate at a higher speed in the track state. According to the track-and-hold circuits 1, 3, and 4 of the present embodiments, the current of the current source $I_{11}$ and the current of the current source $I_{12}$ flow through the third resistor $R_{13}$, and thus the potential of the base electrode of the switching transistor $Q_{21}$ is lower than the potential of the comparative example (FIG. 7), so that the voltage between the base and the collector of the switching transistor $Q_{21}$ increases, and the junction capacitance of the junction decreases. As a result, a higher-speed operation becomes possible.

According to the track-and-hold circuits 2 and 5 of the present embodiment, the circuit network including the fourth resistor $R_{14}$, the fifth resistor $R_{15}$, and the sixth resistor $R_{16}$ is equivalent to a circuit network including the first resistor $R_{11}$, the second resistor $R_{12}$ and the third resistor $R_{13}$, so that the same operation and effect as the operation and effects of the track-and-hold circuits 1, 3, and 4 of the present embodiment can be obtained.

Similarly to the relationship between the track-and-hold circuit 3 (FIG. 4) and the track-and-hold circuit 4 (FIG. 5), the hold capacitor of the track-and-hold circuit 5 (FIG. 5) can be reduced to one. In the track-and-hold circuits 1 to 3 and 5, one end of the hold capacitor $C_{21}$ ($C_{22}$) is connected to the positive power supply $V_{CC}$, but one end of the hold capacitor $C_{21}$ ($C_{22}$) may be connected to the negative power supply $V_{EE}$.

Figure 8:
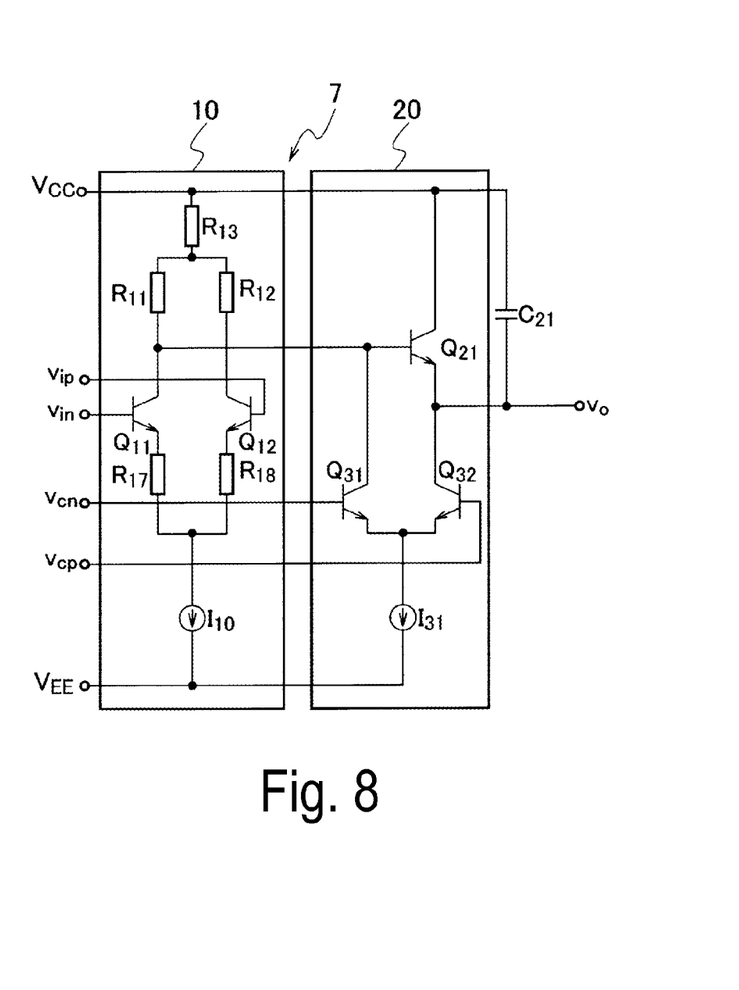
FIG. 8 is a diagram illustrating a configuration example in which a differential amplifier circuit of the track-and-hold circuit illustrated in FIG. 1 is modified.

As illustrated in FIG. 8, the differential amplifier circuit 10 includes a differential pair including a first transistor $Q_{11}$ and a second transistor $Q_{12}$, a seventh resistor $R_{17}$ having one end connected to the emitter electrode of the first transistor $Q_{11}$, an eighth resistor Rig having one end connected to the emitter electrode of the second transistor $Q_{12}$, the other end of the seventh resistor $R_{17}$ and the other end of the eighth resistor Rig being connected, and a current source ho connected between the other ends and the negative power supply $V_{EE}$. The differential amplifier circuit 12 may be similarly configured.

That is, the number of current sources in the differential amplifier circuits of the track-and-hold circuits 1 to 5 of the present embodiments can be reduced to one. The track-and-hold circuits 1 to 5 each including one current source of the differential amplifier circuit have the same operation and effect as when the number of current sources is two.

Further, the track-and-hold circuit of the present embodiment has been described using an NPN transistor as an example. However, like other general circuits, the track-and-hold circuit can be configured with PNP transistors having different polarities. As described above, the present disclosure is not limited to the above-described embodiments, and various modifications can be made within the scope of the principle.

REFERENCE SIGNS LIST 1, 2, 3, 4, 5, 6, 7 Track-and-hold circuit
10, 12 Differential amplifier circuit 20, 22 Switch circuit
$C_{21}$, $C_{22}$, $C_{20}$ Hold capacitor
$Q_{11}$ First transistor (one of differential pair)
$Q_{12}$ Second transistor (the other of differential pair)
vop, von Differential output
$R_{11}$ First resistor
$R_{12}$ Second resistor
$R_{13}$ Third resistor
$R_{14}$ Fourth resistor
$R_{15}$ Fifth resistor
$R_{16}$ Sixth resistor
$R_{17}$ Seventh resistor
$R_{18}$ Eighth resistor
$V_C$: Positive power supply (power supply)
$V_{EE}$ Negative power supply (power supply)

The invention claimed is:

1. A track-and-hold circuit comprising:
a differential amplifier circuit;
a switch circuit; and
a hold capacitor,
wherein the differential amplifier circuit includes:
   a first resistor having one end connected to a collector electrode of a first transistor constituting a differential pair,
   a second resistor having one end connected to a collector electrode of a second transistor constituting the differential pair,
   a third resistor to which the other end of the first resistor and the other end of the second resistor are connected and which is connected between the other ends and a power supply,
   a first current source connected to an emitter electrode of the first transistor,
   a second current source connected to an emitter electrode of the second transistor, and
   a fourth resistor having a first end connected to the emitter electrode of the first transistor and a second end connected to the emitter electrode of the second transistor.

2. A track-and-hold circuit comprising:
a differential amplifier circuit;
a switch circuit; and
a hold capacitor,
wherein the differential amplifier circuit includes:
   a first resistor connected between respective collector electrodes of a first transistor and a second transistor constituting a differential pair,
   a second resistor connected between the collector electrode of the first transistor and a power supply,
   a third resistor connected between the collector electrode of the second transistor and the power supply,
   a first current source connected to an emitter electrode of the first transistor,
   a second current source connected to an emitter electrode of the second transistor, and
   a fourth resistor having a first end connected to the emitter electrode of the first transistor and a second end connected to the emitter electrode of the second transistor.

3. The track-and-hold circuit according to claim 1, wherein the switch circuit includes differential outputs, and the hold capacitor is connected between the differential outputs.

4. The track-and-hold circuit according to claim 2, wherein the switch circuit includes differential outputs, and the hold capacitor is connected between the differential outputs.

* * * * *